US011778767B2

(12) United States Patent
Chen et al.

(10) Patent No.: US 11,778,767 B2
(45) Date of Patent: Oct. 3, 2023

(54) MECHANISM FOR SECURING A PRINTED CIRCUIT BOARD TO A BRACKET

(71) Applicant: QUANTA COMPUTER INC., Taoyuan (TW)

(72) Inventors: Ta-Wei Chen, Taoyuan (TW); Chia-Chun Chen, Taoyuan (TW); Chun Chang, Taoyuan (TW); Jyue Hou, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 512 days.

(21) Appl. No.: 17/005,563

(22) Filed: Aug. 28, 2020

(65) Prior Publication Data

US 2021/0360812 A1 Nov. 18, 2021

Related U.S. Application Data

(60) Provisional application No. 63/025,707, filed on May 15, 2020.

(51) Int. Cl.
*G06F 1/16* (2006.01)
*H05K 5/00* (2006.01)
*H05K 7/00* (2006.01)
*H05K 7/14* (2006.01)

(52) U.S. Cl.
CPC ......... *H05K 7/1405* (2013.01); *H05K 7/1407* (2013.01); *H05K 7/1408* (2013.01)

(58) Field of Classification Search
CPC .. H05K 7/1405; H05K 7/1407; H05K 7/1408; H05K 7/1402; H05K 7/1417; H05K 7/1409
See application file for complete search history.

(56) References Cited

U.S. PATENT DOCUMENTS

| | | | |
|---|---|---|---|
| 6,693,798 B1 * | 2/2004 | Conn | G06F 1/185 361/801 |
| 2003/0107878 A1 * | 6/2003 | Kaminski | H05K 7/1405 361/759 |
| 2006/0232952 A1 * | 10/2006 | Peng | G06F 1/185 361/801 |
| 2013/0088831 A1 * | 4/2013 | Zheng | H05K 7/1424 361/679.43 |
| 2021/0251099 A1 * | 8/2021 | Tsorng | H05K 7/1411 |
| 2022/0229474 A1 * | 7/2022 | Ma | G06F 1/186 |

* cited by examiner

*Primary Examiner* — Anthony M Haughton
(74) *Attorney, Agent, or Firm* — NIXON PEABODY LLP

(57) ABSTRACT

A swing arm lock mechanism for securing a printed circuit board to a bracket includes a main body, a hooked arm, and an aperture in the main body. The hooked arm extends from and is integral with the main body. The hooked arm and main body define an open-ended slot for engaging a lock pin disposed on the bracket. The aperture receives a fastener for securing the main body to the printed circuit board such that the main body and hooked arm can rotate about a central axis of the fastener from a first unlocked position to a second locked position.

20 Claims, 6 Drawing Sheets

MECHANISM FOR SECURING A PRINTED CIRCUIT BOARD TO A BRACKET

CROSS-REFERENCE TO RELATED APPLICATION

This application claims priority under 35 U.S.C. § 119 to U.S. Provisional Application No. 63/025,707, entitled "THE TOOL LESS FIXTURES ON THE SLIDING DEVICE", filed on May 15, 2020. The contents of that application are hereby incorporated by reference in their entirety.

FIELD OF THE INVENTION

The present invention relates to securing a printed circuit board within a computer device. More specifically, the present invention relates to a swing arm mechanism for securing a printed circuit board to a bracket within a computer device.

BACKGROUND

A printed circuit board ("PCB") is typically fixed to a computer chassis, or bracket within a computer chassis, with a thumb-type screw or other fastening mechanism that is secured using a tool. The process of assembling computer hardware components that include a PCB can be time consuming when a tool is needed to properly secure the PCB. Similarly, the process of removing and installing a PCB can also be time consuming when a tool is needed to tighten and loosen the fastening mechanism for the PCB.

For ease in assembling computer hardware components or replacing a PCB in a computer device, there is a need for a lock mechanism that reduces the amount of time involved in the process. Accordingly, the present disclosure is directed to reducing time required in removing or installing a PCB.

SUMMARY

According to one embodiment, a swing arm lock mechanism for securing a printed circuit board ("PCB") to a bracket includes a main body, a hooked arm extending from an integral with the main body, and an aperture in the main body. The hooked arm and main body define an open-ended slot for engaging a lock pin disposed on the bracket. The aperture in the main body receives a fastener to secure the main body to the PCB such that the main body and hooked arm can rotate about a central axis of the fastener from a first unlocked position to a second locked position.

A further aspect of the embodiment includes a first dimple on a bottom surface of the main body for engaging an aperture in the PCB to constrain the main body and hooked arm in the first unlocked position. Yet another aspect includes a second dimple on an interior surface of the open-ended slot for engaging the lock pin to constrain the main body and hooked arm in the second locked position. Yet another aspect includes the hooked arm bending away from the open-ended slot as the second dimple engages the lock pin. In yet another aspect, the main body includes a partially curved edge for engaging the lock pin to align the PCB during the securing of the PCB to the bracket. Yet another aspect includes the main body and the hooked arm being a semi-rigid polymer material. In yet another aspect, the fastener includes a nut extending upwardly from the PCB through the entire height of the aperture to above a top surface of the main body. In yet another aspect, the fastener further includes a screw with a head having a diameter greater than a diameter of the nut and the aperture, such that a gap is formed between a bottom surface of the head and the top surface of the main body when the screw is secured to the nut, thereby allowing rotation of the main body and hooked arm. In yet another aspect, the locked pin includes a groove having a first diameter that is less than a diameter of the locked pin above and below the groove. In yet another aspect, the open-ended slot includes a slot opening that is wider than the first diameter and less than the diameter of the lock pin immediately above and below the groove.

According to another embodiment, a printed circuit board assembly includes a swing arm lock mechanism for securing a printed circuit board ("PCB") to a bracket. The PCB assembly comprises a swing arm lock mechanism that includes a main body, a hooked arm extending from and integral with the main body such that the hooked arm and main body define an open-ended slot for engaging a lock pin secured to a bracket, and a first aperture in the main body. The first aperture receives a fastener to secure the main body to the PCB such that the main body and hooked arm can rotate about the fastener from a first unlocked position to a second locked position. The PCB comprises a second aperture configured to engage a fastening pin with a head extending from the bracket. The PCB is configured to slide along a direction parallel to the bracket when the fastening pin engages with the second aperture and to constrain movement of PCB when the main body and hooked arm are rotated into the second locked position.

A further aspect of the embodiment includes the second aperture having a keyhole shape. In yet another aspect, the swing arm lock mechanism includes a first dimple on a bottom surface of the main body for engaging a third aperture in the PCB to constrain the main body and hooked arm in the first unlocked position. In yet another aspect, the swing arm lock mechanism includes a second dimple on an interior surface of the open-ended slot for engaging the lock pin to constrain the main body and hooked arm in the second locked position. In yet another aspect, the hooked arm bends away from the open-ended slot as the second dimple engages the lock pin. In yet another aspect, the main body includes a partially curved edge for engaging the lock pin to align the PCB during the securing of the PCB to the bracket. Yet another aspect includes the main body and the hooked arm being a semi-rigid polymer material. In yet another aspect, the fastener includes a nut extending upwardly from the PCB through the entire length of the aperture to above a top surface of the main body. In yet another aspect, the fastener further includes a screw with a head having a diameter greater than a diameter of the nut and the aperture, such that a gap is formed between a bottom surface of the head and the top surface of the main body when the screw is secured to the nut, thereby allowing rotation of the main body and hooked arm. Yet another aspect includes the PCB being a fan board. In yet another aspect, the bracket is a horizontal bracket connected to a vertical structure in the computer chassis.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1:
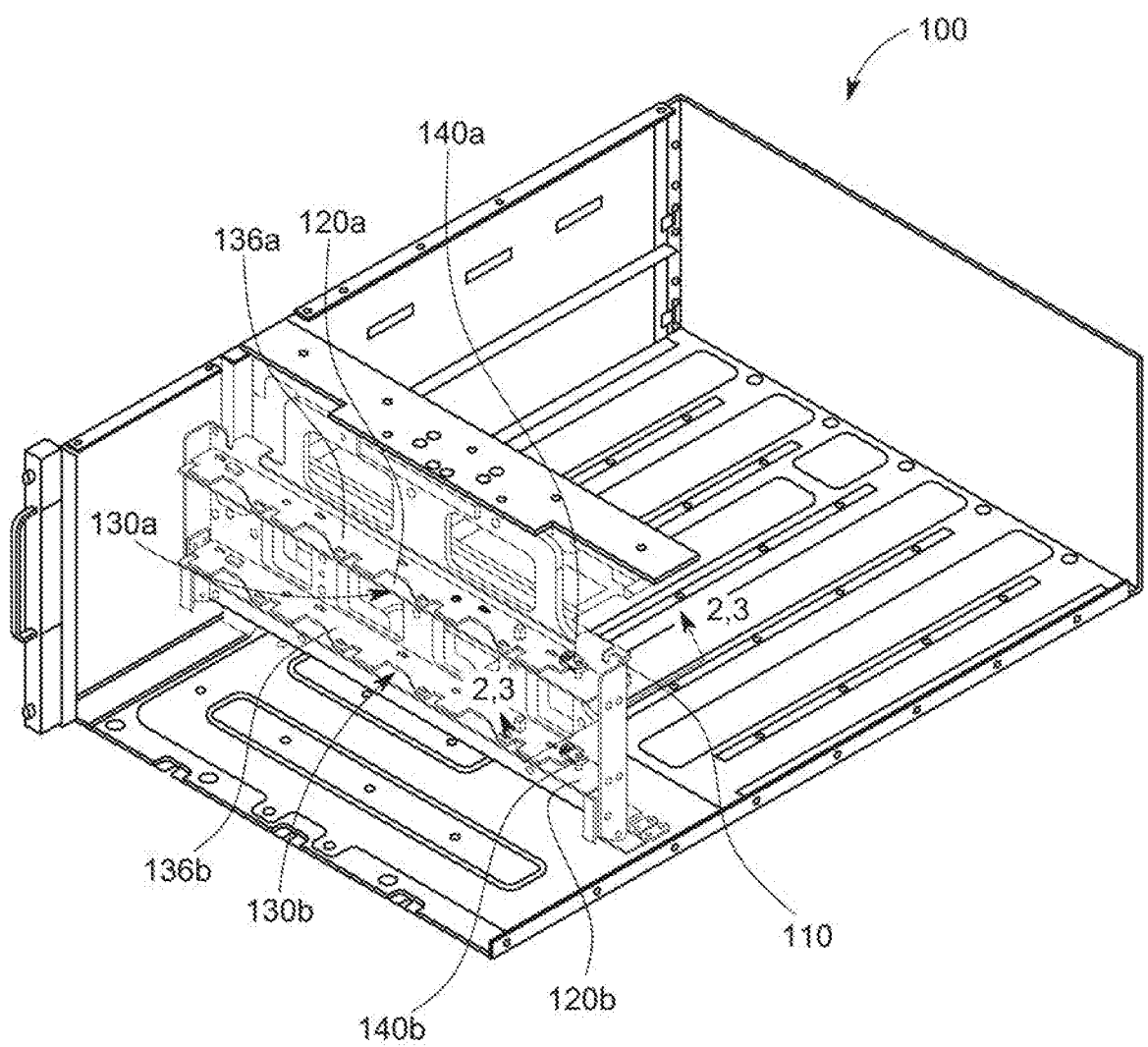
FIG. 1 is an exemplary partial perspective view of a chassis that includes a vertical support with horizontal brackets for supporting printed circuit board assembly ("PCBA"), according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various implementations of the present disclosure are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various implementations can be practiced without one or more of the specific details, or with other methods. In other instances, well-known structures or operations are not shown in detail to avoid obscuring certain aspects of the various embodiments. The various implementations are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the term "computer device" refers to any electronically-powered or battery-powered equipment that has hardware, software, and/or firmware components, where the software and/or firmware components can be configured for operating features on the equipment.

In some implementations of the present disclosure a swing arm lock mechanism is contemplated for securing a printed circuit board ("PCB") by engaging a lock pin coupled to a bracket coupled to a computer chassis. A desirable aspect of the present disclosure includes allowing quicker assembly and maintenance of computer hardware components, such as PCBs and related components. For example, the presently disclosed swing arm lock mechanism increases the efficiency and ease in replacing computer components.

Turning now to FIG. 1, an exemplary partial perspective view of a computer chassis 100 with a top cover, side wall, and front wall removed, is depicted. The computer chassis 100 includes a vertical support structure 110 with one or more horizontal brackets 120a, 120b for supporting printed circuit board assemblies ("PCBA") 130a, 130b. The PCBAs 130a, 130b are horizontally stacked on the vertical support structure 110. In such a stacked scenario, swing arm lock mechanisms, such as 140a, 140b, are desirable because they provide for a tool-less operation for installing and removing the PCBAs from the computer chassis 100. Other configurations are also contemplated that provide desirable scenarios for the present swing arm lock mechanism, such as where access to a PCBA inside a computer chassis is limited whether the PCBA is installed horizontally or vertically within a computer chassis.

In some implementations, the vertical support structure 110 has one or more brackets, such as horizontal brackets 120a, 120b, connected thereto. A printed circuit board assembly, such as PCBAs 130a or 130b, is coupled to a corresponding horizontal bracket 120a, 120b. The PCBA can include a swing arm lock mechanism, such as 140a or 140b, and a PCB, such as 136a or 136b. In some implementations, the PCBA 130a, 130b can be coupled to another bracket, such as a vertical bracket or another type of support structure for a PCB or a PCBA. In some implementations, the PCB 136a, 136b can be a component board, such as a fan board.

Figure 2:
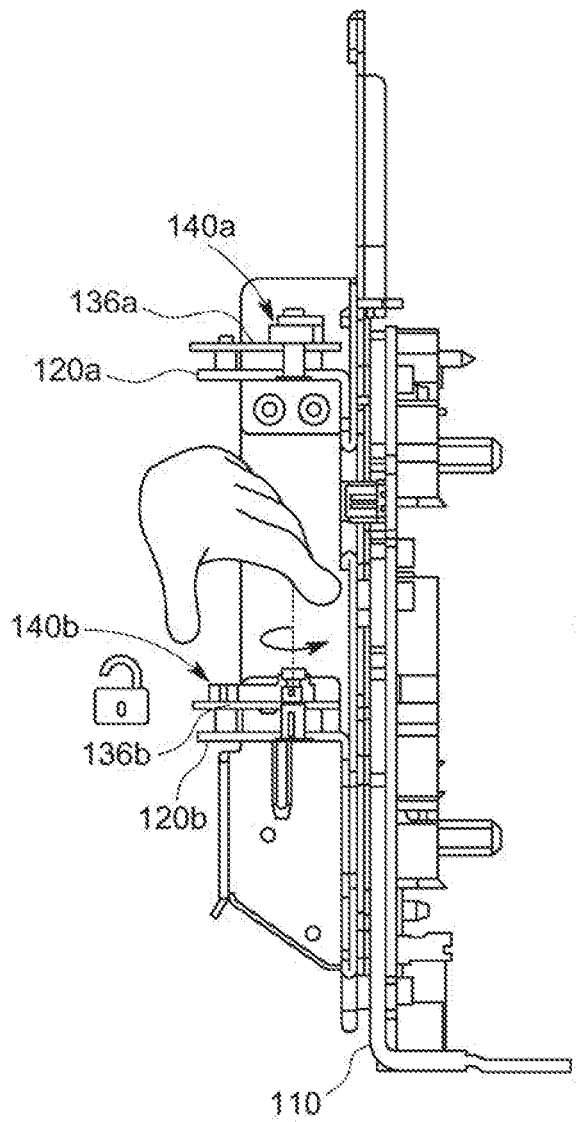
FIG. 2 is a side view of the vertical support in FIG. 1 depicting a swing arm lock mechanism for securing the printed circuit board to a horizontal bracket with the lock mechanism in an unlocked position, according to some implementations of the present disclosure.
Figure 3:
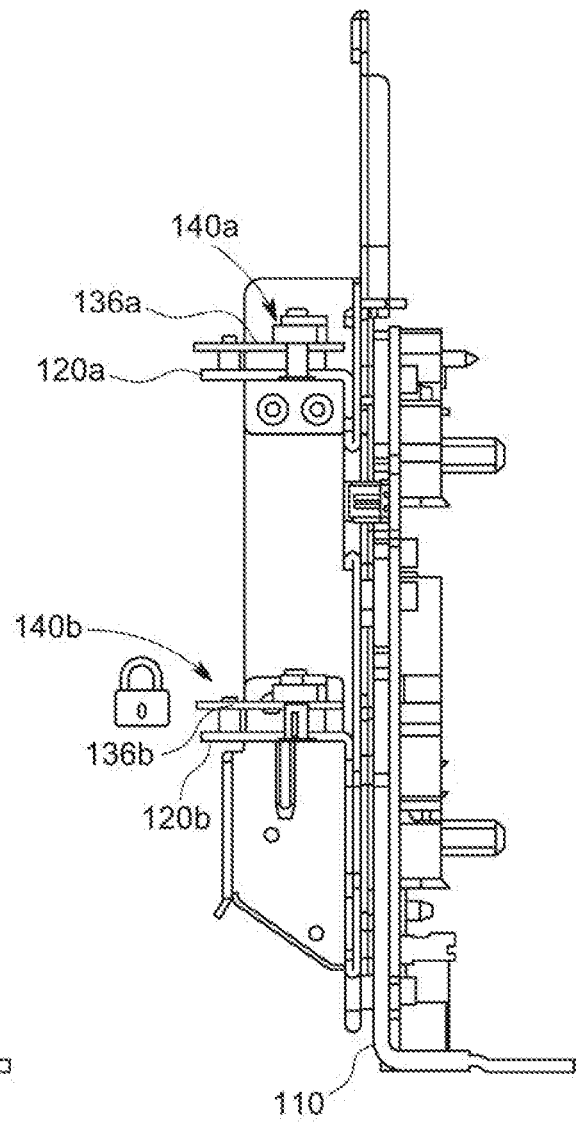
FIG. 3 is a side view of the vertical support in FIG. 1 depicting a swing arm lock mechanism for securing the printed circuit board to a horizontal bracket with the lock mechanism in a locked position, according to some implementations of the present disclosure.

Turning now to FIGS. 2 and 3, a side view is depicted of the vertical support structure 110 in FIG. 1, including first and second swing arm lock mechanisms 140a, 140b that secure and release the printed circuit boards ("PCB") 136a, 136b from first and second horizontal brackets 120a, 120b. In both FIGS. 2 and 3, the first swing arm lock mechanism 140a is illustrated in a locked position where the PCB 136a is fully secured to the first horizontal bracket 120a. In FIG. 2, second swing arm lock mechanism 140b is illustrated in an unlocked position where the PCB 136b is not fully secured or locked to the second horizontal bracket 120b. As the second swing arm lock mechanism 140b is rotated, such as during the assembly or replacement of a board by a technician, the second swing arm lock mechanism 140b engages with a vertical pin, such as a locking pin, extending perpendicularly from the second horizontal bracket 120b. The second swing arm lock mechanism 140b continues rotating to fully engage the vertical pin such that a fully locked position is achieved that secures the PCB 136b to the second horizontal bracket 120b.

Figure 4:
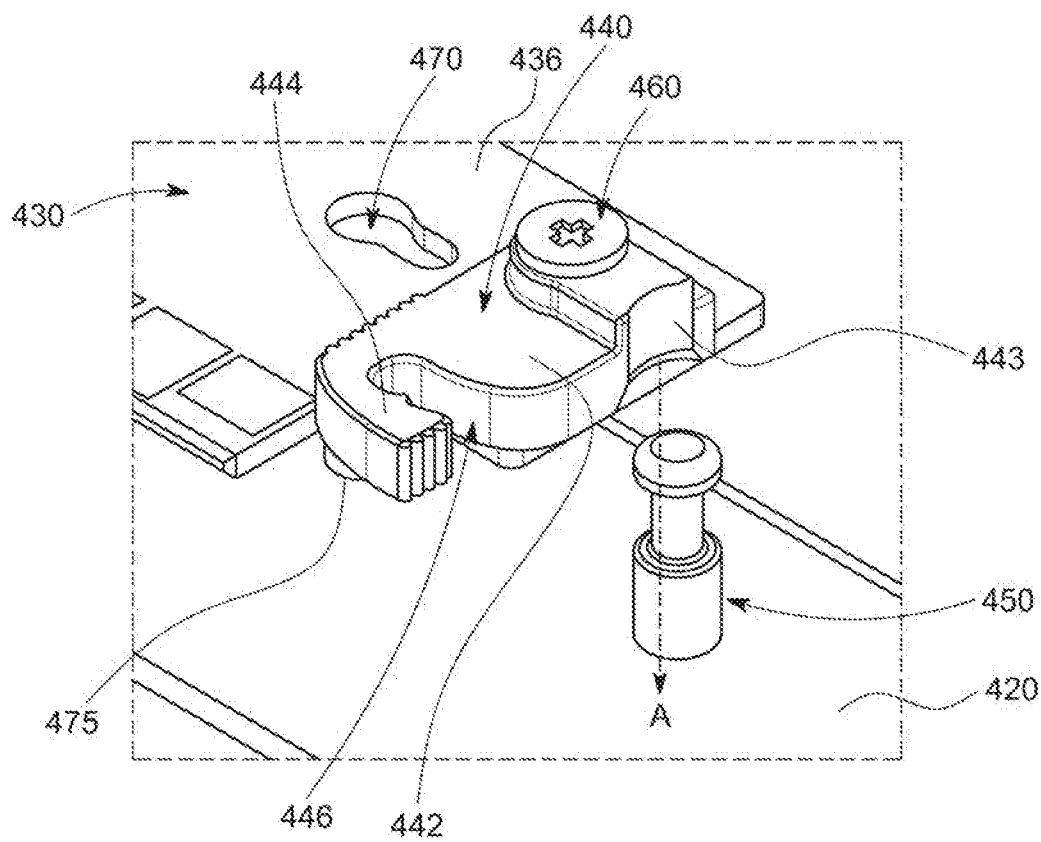
FIG. 4 is a perspective view of a swing arm lock mechanism of a PCBA in a first unlocked position before securing the PCBA to a bracket, according to some implementations of the present disclosure.

Turning now to FIG. 4, a perspective view is depicted of a portion of the PCBA 430 that includes a swing arm lock mechanism 440 in a first position that may also be referred to as a released position before securing the PCBA 430 to a bracket 420. The PCBA 430 is disposed above the bracket 420 and is moved toward the bracket 420 in direction A.

The PCBA 430 includes the swing arm lock mechanism 440 and a PCB 436. The swing arm lock mechanism 440 includes a main body 442 and a hooked arm 444 laterally extending from the main body 442. In some implementations, the hooked arm 444 is integral with the main body 442. The hooked arm 444 and main body 442 define an open-ended slot 446 for engaging a lock pin 450 coupled to the bracket 420. The swing arm lock mechanism is secured to the PCB 436 via a fastener 460 extending through a securing aperture (see FIG. 11) in the main body 442. The swing arm lock mechanism rotates about a longitudinal axis extending through the center of the fastener 460. The swing arm lock mechanism 440 rotates about the longitudinal axis of the fastener from an initial unlocked or released position to a final locked position. The swing arm lock mechanism 440 rotates in a reverse direction when the PCBA needs to be removed or replaced.

In some implementations, the swing arm lock mechanism 440 has an overall length within a range of approximately 0.7 to approximately 1.5 inches, and an overall width within a range of approximately 0.3 to approximately 0.8 inches. In some implementation, the hooked arm 444 has a height or thickness within a range of approximately 0.1 inches to approximately 0.25 inches. In some implementations, at least a portion of the main body 442 has the same thickness as the thickness of the hooked arm 444.

The lock pin 450 extends perpendicularly from the bracket 420 and is engaged by the open-ended slot 446 between the hooked arm 444 and the main body 442 of the swing arm lock mechanism 440. The open-ended slot portion of the swing arm lock mechanism 440 is used to secure or lock the PCBA 430 to the bracket 420.

The PCB 436 includes an aperture 470 that in some implementations is shaped as a keyhole for receiving a fastening pin 475 that is coupled to the bracket 420. The received fastening pin 475 aids in coupling the PCBA 430 to the bracket 420.

The swing arm lock mechanism 440 can also include a first dimple (see dimple 448 in FIGS. 8 and 11) on a bottom surface of the main body 442. The first dimple is for engaging a constraining aperture (see hole 438 in FIGS. 8-10) in the PCB 436 that constrains the swing arm lock mechanism 440 in an initial unlocked, or released, position, such as before the PCBA 430 is installed and secured to the bracket 420. The main body 442 of the swing arm lock mechanism 440 can further include an at least partially curved edge 443 for engaging the lock pin 450 to align the PCBA 430 as the PCBA is moved in direction A along the z-axis toward the bracket 420 prior to securing the PCBA 430 to the bracket 420. It is contemplated that the main body 442 and the hooked arm 444 can be fabricated from different materials, including a semi-rigid polymer material.

Figure 5:
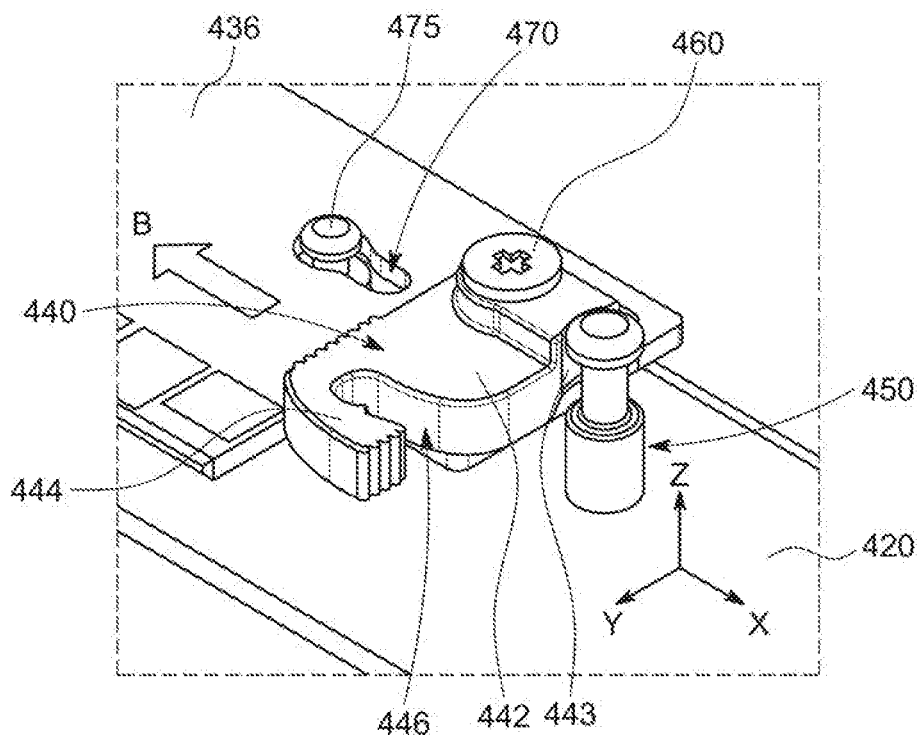
FIG. 5 is a perspective view of the swing arm lock mechanism in FIG. 4 depicted in a second unlocked position before securing the PCBA to a bracket, according to some implementations of the present disclosure.

Turning now to FIG. 5, a perspective view of the swing arm lock mechanism 440 in FIG. 4 is depicted in a second unlocked position before securing the PCBA 430 to the bracket 420. The PCBA 430 is depicted after being moved in direction A (see FIG. 4) so it is disposed just above a top surface of bracket 420. The fastener pin 475 that is coupled to the bracket 420 extends through the aperture 470, and the curved edge 443 of the main body 442 is aligned with the lock pin 450.

Figure 6:
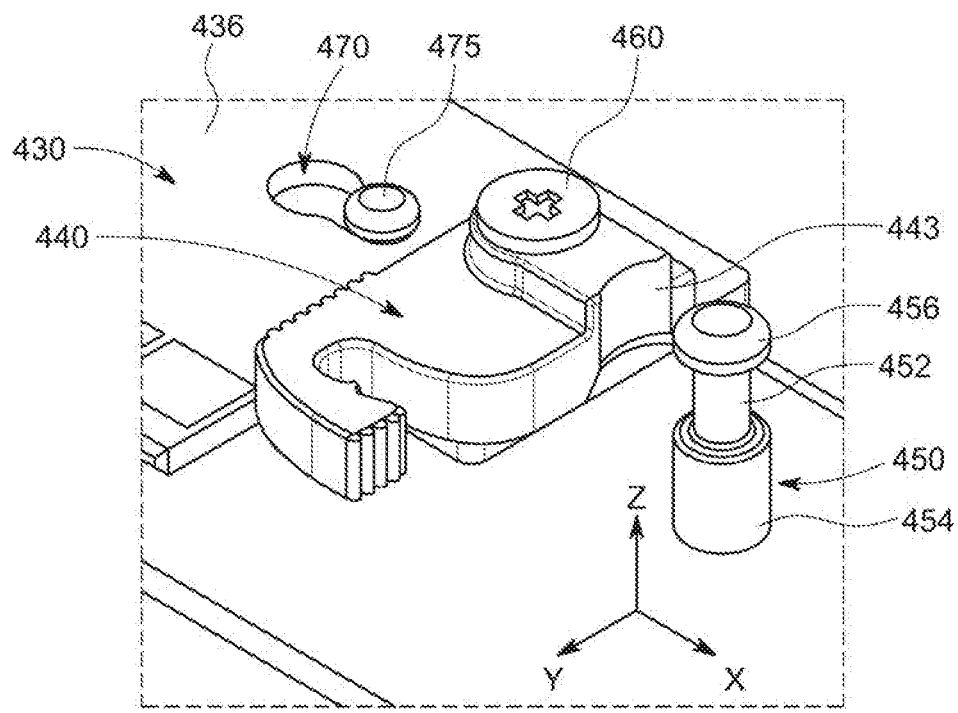
FIG. 6 is a perspective view of the swing arm lock mechanism depicted in FIG. 4 depicted in a third position partially securing the PCBA to a bracket, according to some implementations of the present disclosure.

Turning now to FIG. 6, a perspective view of the swing arm lock mechanism 440 in FIG. 4 is depicted in a third position with the PCBA 430 being partially secured to the bracket 420. After the aperture 470 (e.g., keyhole) receives the fastener pin 475, as depicted in FIG. 5, the PCBA 430 is moved in direction B within the aperture 470 (see FIG. 5) along the x-axis, for example, by sliding until the fastener pin 475 enters a slot having a width smaller than a small diameter of the fastener pin 475. Once the fastener pin 475 is slid into the slot of aperture 470, the PCBA 430 is now at least partially constrained from moving along the z-axis and from moving laterally along the y-axis other than by rotation about the fastener pin 475.

Figure 7:
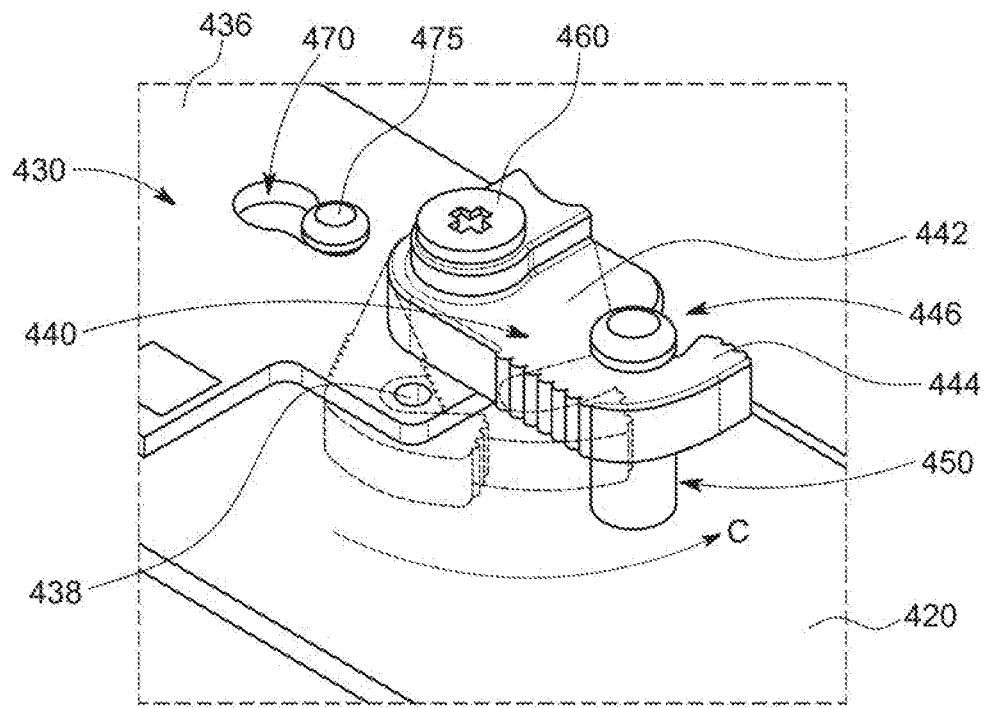
FIG. 7 is a perspective view of the swing arm lock mechanism depicted in FIG. 4 depicted in a fourth locked position securing the PCBA to a bracket, according to some implementations of the present disclosure.

Turning now to FIG. 7, a perspective view of the swing arm lock mechanism 440 in FIG. 4 is depicted in a fourth locked position where the PCBA 430 is secured to a bracket 420. After the fastener pin 475 is slid into the slot of aperture 470, the swing arm lock mechanism 440 is rotated in direction C about the longitudinal axis through the center of the fastener 460. During the rotation of the swing arm lock mechanism 440, a dimple (see dimple 448 in FIGS. 8 and 11) on a bottom surface of the main body 442, that engages a constraining aperture (see hole 438 in FIGS. 8-10) in the PCB 436, causes the PCBA 430, the swing arm lock mechanism 440, or both, to deform to the point of allowing the dimple to exit the constraining aperture 438 and release the swing arm lock mechanism 440 to allow it to freely rotate. The swing arm lock mechanism 440 then continues to rotate until the open-ended slot 446 defined by the hooked arm 444 and the main body 442 engages the lock pin 450 and the lock pin 450 substantially penetrates the length of the slot 446, such that the PCBA 430 is fully locked.

Figure 8:
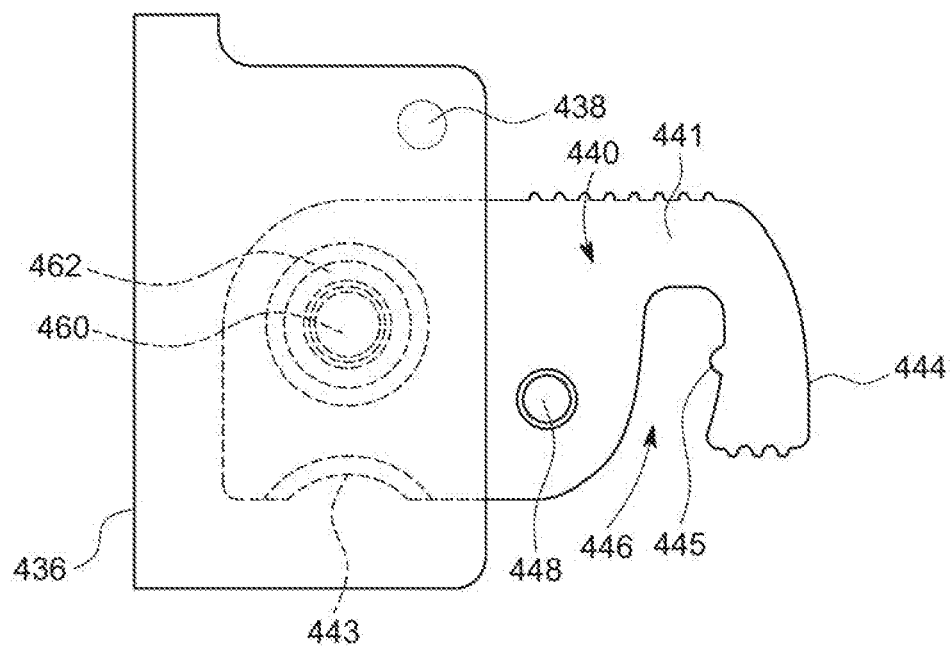
FIG. 8 is a bottom view of a swing arm lock mechanism, according to some implementations of the present disclosure.

Turning now to FIG. 8, a bottom view of a swing arm lock mechanism 440 secured to the PCB 436 is depicted. The swing arm lock mechanism 440 is in the locked position, similar to the position depicted in FIG. 7. The constraining aperture 438 and dimple 448 are on the bottom surface 441 of the swing arm mechanism 440. The dimple 448 is depicted after exiting the constraining aperture 438 and after the swing arm lock mechanism 440 has rotated such that the open-ended slot 446 has engaged the lock pin 450 (see for example FIG. 7 or 9). A second dimple 445 extends from the hooked arm 444 on an interior surface of the open-ended slot 446. The second dimple 445 engages the lock pin 450. After the lock pin 450 moved into the open-ended slot 446 beyond the second dimple 445, the swing arm lock mechanism 440 is constrained in the locked position.

The depicted bottom view of the swing arm lock mechanism 440 includes hidden lines for portions of the swing arm lock mechanism 440 that are covered by the PCBA 436. The bottom view depicts the fastener 460, that in some implementations can be a screw, along with a nut 462 that extends upwardly from the PCB 436 through the height of the securing aperture (see element 462 in FIG. 11) to above a top surface of the main body 442.

Figure 9:
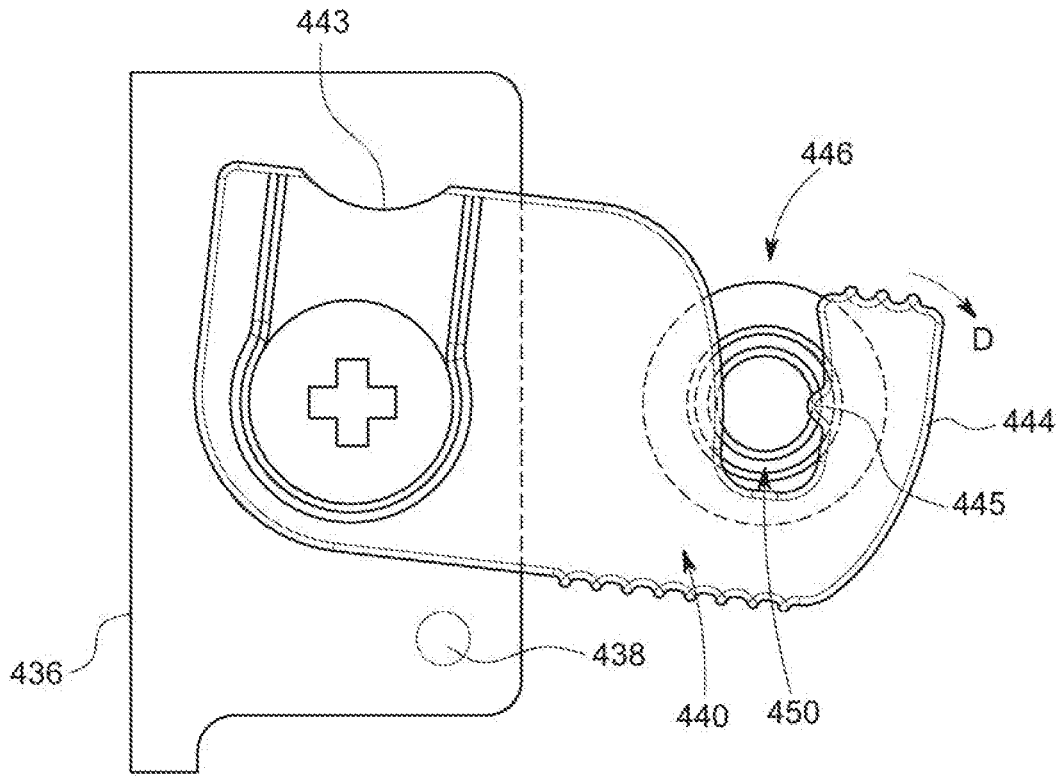
FIG. 9 is a top view of a swing arm lock mechanism immediately prior to being in a fully locked position, according to some implementations of the present disclosure.

Turning now to FIG. 9, a top view of a swing arm lock mechanism is depicted immediately prior to being in a fully locked position. The dimple 448 depicted in FIGS. 8 and 11 has exited the constraining aperture 438 and the swing arm lock mechanism, including the hooked arm 444, and has rotated such that the open-ended slot 446 engages the lock pin 450. The second dimple 445 extending from an interior surface of the hooked arm 444 into the open-ended slot engages the lock pin 450. As the second dimple 445 engages the lock pin, the hooked arm 444 bends away (e.g., is pushed out) thereby causing a rotation of the hooked arm 444 in direction D. The continued rotation in direction D of the hooked arm causes the slot width of the open-end slot 446 to increase to the diameter of the portion of the lock pin 450 that is engaged within the open-ended slot between the second dimple 445 and the main body. Once the lock pin 450 passes the second dimple 445 and moves deeper into the open-ended slot 446, the swing arm lock mechanism 440 fully engages the lock pin 450 and constrains the entire PCBA 430 in the locked position depicted in FIG. 7.

Figure 10:
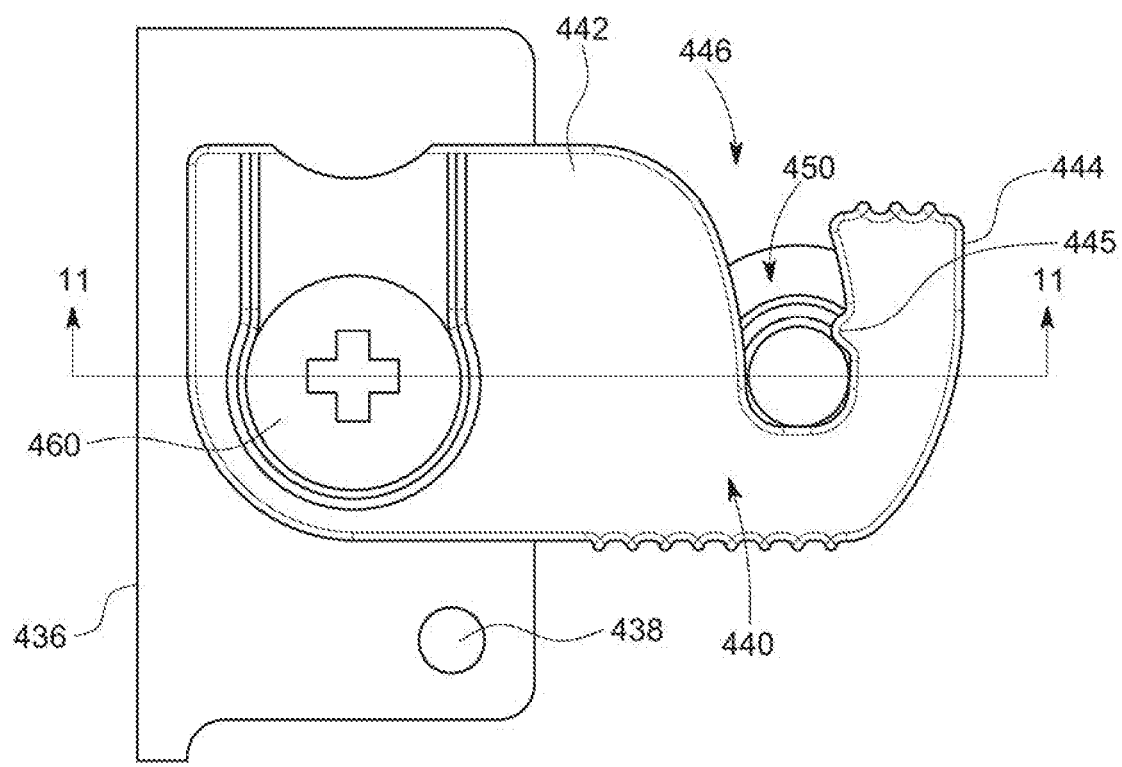
FIG. 10 is a top view of a swing arm lock mechanism in a fully locked position, according to some implementations of the present disclosure.

Turning now to FIG. 10, a top view of a swing arm lock mechanism 440 in a fully locked position is depicted along with the PCB 436. FIG. 10 is an extension of FIG. 9 and depicts the lock pin 450 having passed the second dimple 445 and moved deeper into the open-ended slot 446. The hooked arm 444 has returned to a relaxed or near relaxed position where it has at least partially rebounded after being rotated in direction D and bent away from the open-ended slot 446. In the position depicted in FIG. 10, the second dimple 445 acts as a mechanism to keep the swing arm lock mechanism 440 in a locked position about the lock pin 450. The swing arm mechanism can exit the locked position by a force being applied (e.g., by a technician or a tool) to the swing arm lock mechanism 440 that overcomes the locking forces applied to the lock pin 450 by the second dimple and the swing arm lock mechanism 440.

Figure 11:
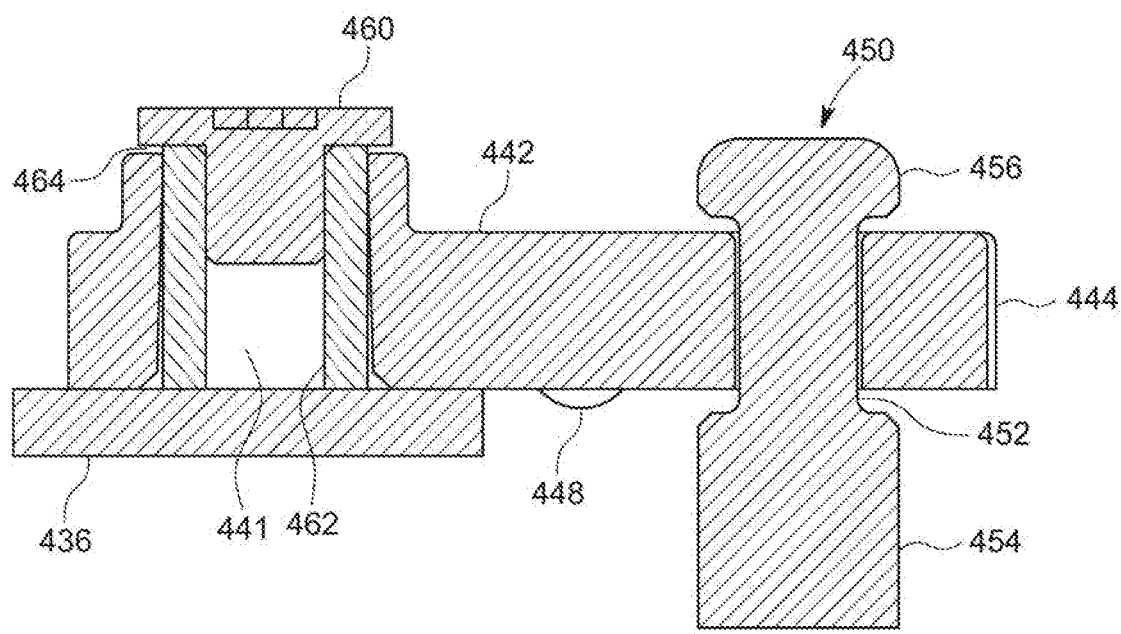
FIG. 11 is a cross-sectional view of the swing arm lock mechanism of FIG. 10 in the fully locked position, according to some implementations of the present disclosure.

Turning now to FIG. 11, a cross-sectional view of the swing arm lock mechanism 440 of FIG. 10 in a fully locked position is depicted. The cross-section includes details of the fastener 460 and lock pin 450 components, according to some implementations. The fastener 460 can be a screw-type fastener that includes threads for engaging an at least partially threaded (not shown) nut 462 coupled to the PCB 436. The nut 462 extends perpendicularly from the PCB 436 through the height of a securing aperture 441 defined by the main body 442 of the swing arm lock mechanism. When fully tightened, the exemplary screw-type fastener 460 sits on a top surface of the nut 462 such that a gap 464 of approximately one-hundredth to several hundredths of an inch (e.g., approximately 0.1 mm to 0.6 mm) is created between a bottom surface of the head of the fastener 460 and the top surface of the main body 442 immediately adjacent to the securing aperture 441 defined by the main body 442. In some implementations, the gap 464 may be larger. In other implementations, the gap 464 may be smaller. The gap 464 is configured to include tolerances that allow the swing arm lock mechanism 440 to rotate about the longitudinal axis through the center point of the fastener 460. The gap 464 may further be configured to allow for some movement along the z-axis of the swing arm lock mechanism 440. The gap 464 can also be configured to allow for movement due to deformation of the PCB 436 as the dimple 448 disengages from the constraining aperture 438 when the swing arm lock mechanism 440 is rotated to a locked position. The gap 464 can further be configured to allow for movement due to deformation as the dimple 448 engages the PCB 436 when rotating in the opposite direction to a released or unlocked position.

In some implementations, the locked pin 450 includes a groove 452 having a first diameter that is less than a second diameter of a top component 456 of the locked pin immediately above the groove 452 and less than a third diameter of a bottom component 454 of the lock pin 450 immediately below the groove 452. In some implementations, the open-ended slot (e.g., element 446 in FIG. 10) is wider than the first diameter of the groove 452 and less than the second diameter of top component and the third diameter of the bottom component 454 of the lock pin 450. In some implementations, the first diameter of the groove 452 of the lock pin 450 is within a range of approximately 0.08 to 0.2 inches.

In some implementations, a printed circuit board assembly is contemplated that includes a swing arm lock mechanism as described above in FIGS. 1-11 for securing a printed circuit board ("PCB") to a bracket. The swing arm lock mechanism can include a main body and a hooked arm extending from and integral with the main body. The hooked arm and the main body define an open-ended slot for engaging a lock pin secured to a bracket. A first aperture in the main body receives a fastener to secure the main body to the PCB such that the main body and hooked arm can rotate about the fastener from a first unlocked position to a second locked position. The PCB can include a second aperture, such as a keyhole or other hole-like structure, configured to engage a fastening pin with a head that extends from the bracket. The PCB is configured to slide along a direction parallel to the bracket when the fastening pin engages with the second aperture. The PCB is further constrained in its movement when the main body and hooked arm are rotated into the second locked position.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A swing arm lock mechanism for securing a printed circuit board ("PCB") to a bracket, the PCB having a second aperture that engages a fastening pin disposed on the bracket, the swing arm lock mechanism comprising:
    a main body;
    a hooked arm extending from and integral with the main body, the hooked arm and main body defining an open-ended slot for engaging a lock pin disposed on the bracket; and
    a securing aperture in the main body for receiving a fastener to secure the main body to the PCB such that a separation between the main body and the lock pin is adjustable between a first distance and a second distance based on the engagement of the fastening pin on the bracket and the second aperture of the PCB, wherein the main body and hooked arm can rotate about a central axis of the fastener from a first unlocked position to a second locked position when the separation is the first distance, the first distance being greater than the second distance.

2. The swing arm lock mechanism of claim 1, further comprising a first dimple on a bottom surface of the main body for engaging a constraining aperture in the PCB to constrain the main body and hooked arm in the first unlocked position.

3. The swing arm lock mechanism of claim 1, further comprising a second dimple on an interior surface of the open-ended slot for engaging the lock pin to constrain the main body and hooked arm in the second locked position.

4. The swing arm lock mechanism of claim 3, wherein the hooked arm bends away from the open-ended slot as the second dimple engages the lock pin.

5. The swing arm lock mechanism of claim 1, wherein the main body includes a partially curved edge for engaging the lock pin to align the PCB during the securing of the PCB to the bracket.

6. The swing arm lock mechanism of claim 1, wherein the main body and the hooked arm are a semi-rigid polymer material.

7. The swing arm lock mechanism of claim 1, wherein the fastener includes a nut extending upwardly from the PCB through the entire height of the securing aperture to above a top surface of the main body.

8. The swing arm lock mechanism of claim 7, wherein the fastener further includes a screw with a head having a diameter greater than a diameter of the nut and the securing aperture, such that a gap is formed between a bottom surface of the head and the top surface of the main body when the screw is secured to the nut, thereby allowing rotation of the main body and hooked arm.

9. The swing arm lock mechanism of claim 1, wherein the locked pin includes a groove having a first diameter that is less than a diameter of the locked pin above and below the groove, and wherein the open-ended slot includes a slot opening that is wider than the first diameter and less than the diameter of the lock pin immediately above and below the groove.

10. A printed circuit board assembly including a swing arm lock mechanism for securing a printed circuit board ("PCB") to a bracket, the PCB assembly comprising:
    a swing arm lock mechanism including
        a main body,
        a hooked arm extending from and integral with the main body such that the hooked arm and main body define an open-ended slot for engaging a lock pin secured to a bracket, and
        a first aperture in the main body for receiving a fastener to secure the main body to the PCB such that the main body and hooked arm can rotate about the fastener from a first unlocked position to a second locked position; and
    the PCB including a second aperture configured to engage a fastening pin with a head extending from the bracket, the PCB configured to slide along a direction parallel to the bracket when the fastening pin engages with the second aperture, the PCB configured to slide along the bracket to displace the fastening pin from a first engagement position within the second aperture to a second engagement position within the second aperture such that movement of PCB is constrained when the main body and hooked arm are rotated into the second locked position.

11. The printed circuit board assembly of claim 10, wherein the second aperture is having a keyhole shape.

12. The printed circuit board assembly of claim 10, wherein the swing arm lock mechanism includes a first dimple on a bottom surface of the main body for engaging a third aperture in the PCB to constrain the main body and hooked arm in the first unlocked position.

13. The printed circuit board assembly of claim 10, wherein the swing arm lock mechanism includes a second dimple on an interior surface of the open-ended slot for engaging the lock pin to constrain the main body and hooked arm in the second locked position.

14. The printed circuit board assembly of claim 13, wherein the hooked arm bends away from the open-ended slot as the second dimple engages the lock pin.

15. The printed circuit board assembly of claim 10, wherein the main body includes a partially curved edge for engaging the lock pin to align the PCB during the securing of the PCB to the bracket.

16. The printed circuit board assembly of claim 10, wherein the main body and the hooked arm are a semi-rigid polymer material.

17. The printed circuit board assembly of claim 10, wherein the fastener includes a nut extending upwardly from the PCB through the entire length of the first aperture to above a top surface of the main body.

18. The printed circuit board assembly of claim 17, wherein the fastener further includes a screw with a head having a diameter greater than a diameter of the nut and the first aperture, such that a gap is formed between a bottom surface of the head and the top surface of the main body when the screw is secured to the nut, thereby allowing rotation of the main body and hooked arm.

19. The printed circuit board assembly of claim 9, wherein the PCB is a fan board.

20. The printed circuit board assembly of claim 9, wherein the bracket is a horizontal bracket connected to a vertical structure in the computer chassis.

* * * * *